US008755221B2

(12) United States Patent
Estakhri et al.

(10) Patent No.: US 8,755,221 B2
(45) Date of Patent: Jun. 17, 2014

(54) EMULATION OF STATIC RANDOM ACCESS MEMORY (SRAM) BY MAGNETIC RANDOM ACCESS MEMORY (MRAM)

(75) Inventors: Petro Estakhri, Danville, CA (US); Ebrahim Abedifard, Sunnyvale, CA (US); Frederick Jaffin, Gilroy, CA (US); Siamack Nemazie, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 295 days.

(21) Appl. No.: 13/187,402

(22) Filed: Jul. 20, 2011

(65) Prior Publication Data

US 2012/0182795 A1 Jul. 19, 2012

Related U.S. Application Data

(60) Provisional application No. 61/394,201, filed on Oct. 18, 2010.

(51) Int. Cl.
*G11C 11/14* (2006.01)
(52) U.S. Cl.
USPC .......................................................... 365/171
(58) Field of Classification Search
USPC .......................................................... 365/171
See application file for complete search history.

(56) References Cited

U.S. PATENT DOCUMENTS

| 2006/0179277 | A1* | 8/2006 | Flachs et al. ................... 712/207 |
| 2008/0005479 | A1* | 1/2008 | Tremaine ....................... 711/137 |
| 2008/0183903 | A1* | 7/2008 | VanStee et al. .................... 710/5 |
| 2009/0132760 | A1* | 5/2009 | Flynn et al. .................... 711/113 |
| 2009/0172308 | A1* | 7/2009 | Prins et al. ..................... 711/154 |
| 2009/0172499 | A1* | 7/2009 | Olbrich et al. ................. 714/773 |
| 2009/0307473 | A1* | 12/2009 | Miller et al. ................... 712/245 |
| 2010/0293420 | A1* | 11/2010 | Kapil et al. .................... 714/710 |
| 2010/0325334 | A1* | 12/2010 | Tsai et al. ...................... 710/308 |
| 2011/0113260 | A1* | 5/2011 | Ma et al. ........................ 713/193 |
| 2012/0066439 | A1* | 3/2012 | Fillingim ....................... 711/103 |
| 2013/0194879 | A1* | 8/2013 | Perego et al. ............. 365/189.14 |

* cited by examiner

*Primary Examiner* — Huan Hoang
*Assistant Examiner* — Pablo Huerta
(74) *Attorney, Agent, or Firm* — Maryam Imam; IPxLAW Group LLP

(57) ABSTRACT

A magnetic memory system includes a magnetic random access memory (MRAM) including a plurality of magnetic memory banks and operative to store data during a write operation initiated by a write command. The magnetic memory system further includes a first-in-first-out (FIFO) interface device coupled to the MRAM and including a plurality of FIFOs Each of the magnetic memory banks is coupled to a respective one of the plurality of FIFOs, the FIFO being operative to queue write commands on a per magnetic memory bank basis and further operative to issue the queued write commands at a time when the MRAM is not in use, wherein concurrent write operations are performed to at least two of the plurality of magnetic memory banks.

10 Claims, 7 Drawing Sheets

EMULATION OF STATIC RANDOM ACCESS MEMORY (SRAM) BY MAGNETIC RANDOM ACCESS MEMORY (MRAM)

CROSS-REFERENCE TO RELATED APPLICATIONS

This application claims priority to U.S. Provisional Patent Application No. 61/394,201, filed on Oct. 18, 2010 by ESTAKHRI, etl and entitled "EMULATION OF STATIC RANDOM ACCESS MEMORY (SRAM) BY MAGNETIC RANDOM ACCESS MEMORY (MRAM)".

BACKGROUND OF THE INVENTION

1. Field of the Invention

The present invention relates generally to magnetic memory devices including magnetic random access memory (MRAM) elements for data storage and particularly to magnetic memory devices used to emulate static random access memories (SRAMs).

2. Description of the Prior Art

Static random access memory (SRAM) has been used prevalently throughout the recent decades for storage of binary information or data in applications such as computers, handheld devices among many other electronics applications. SRAMs have fast read and write access times making them excellent candidates for applications in need of such requirements. For example, as central processing units (CPUs) have acquired increased speeds, faster memory has been required to keep up with them—SRAMs fit this bill. Similarly, as electronic devices have decreased in size, so have size requirements of SRAMs.

However, due to manufacturing constraints, limitations of manufacturing SRAMs in terms of size and speed have been anticipated and are now being experienced. Thus, devices replacing SRAMs are highly sought-after devices. One such candidate is magnetic random access memory (MRAM). MRAMs have the advantage of being smaller in size, and being non-volatile where data or information stored therein is retained even after power is disconnected. Also, MRAM's read access time is comparable to that of SRAMs. But when it comes to writing/programming/storing of data, MRAM suffers from slower than that of SRAM. It is well known that the write access time of an MRAM is generally longer than its read access time. Thus, while MRAMs hold their own against SRAMs in terms of read access times, they cannot do the same in terms of write access times.

In an effort to compensate for MRAMs' longer write access time, current memory designs employ "burst" operations by increasing the number of data units written to memory. "Burst" refers to writing a number of data units during a write access operation or before the completion of a write operation. However, burst operations require data units to be sequential and because not all data or even most data is sequential, and additionally large bust sizes are not practical.

Thus, the need arises for a non-volatile memory device such as MRAM with comparable system performance to SRAM.

SUMMARY OF THE INVENTION

To overcome the limitations in the prior art described above, and to overcome other limitations that will become apparent upon reading and understanding the present specification, the present invention discloses a method and a corresponding structure for a magnetic memory system including magnetic tunnel junctions (MTJs) and structures and methods for causing such systems to replace SRAMs.

Briefly, an embodiment of the invention includes magnetic memory system comprises a magnetic random access memory (MRAM) including a plurality of magnetic memory banks and operative to store data during a write operation initiated by a write command. The magnetic memory system further includes a first-in-first-out (FIFO) interface device coupled to the MRAM and including a plurality of FIFOs Each of the magnetic memory banks is coupled to a respective one of the plurality of FIFOs, the FIFO being operative to queue write commands on a per magnetic memory bank basis and further operative to issue the queued write commands at a time when the MRAM is not in use, wherein concurrent write operations are performed to at least two of the plurality of magnetic memory banks.

These and other objects and advantages of the present invention will no doubt become apparent to those skilled in the art after having read the following detailed description of the preferred embodiments illustrated in the several figures of the drawing.

IN THE DRAWINGS

Figure 7:
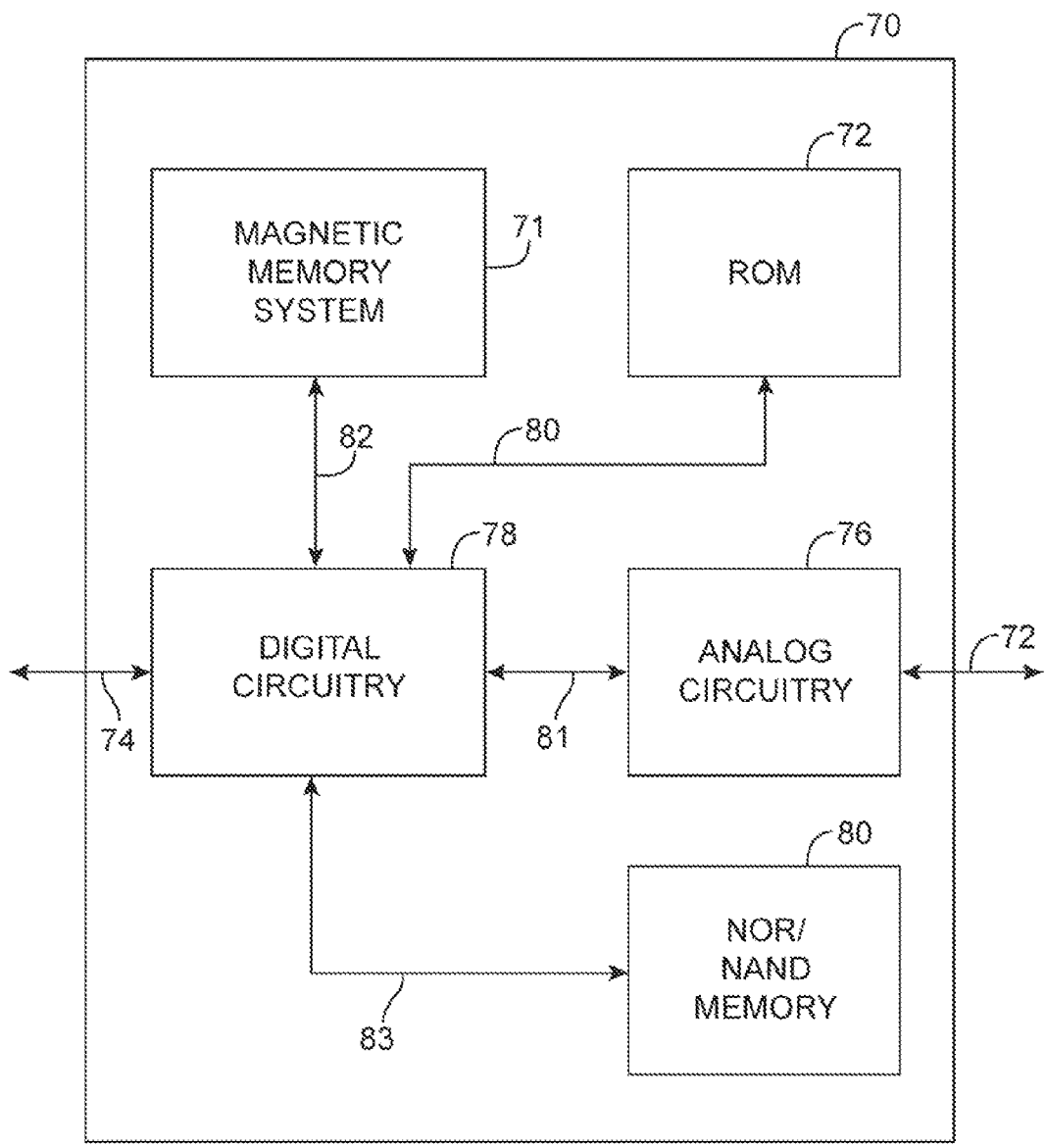

FIG. 7 shows a block diagram of an apparatus 70 incorporating the magnetic memory system 71, which is analogous to the system 10.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1:
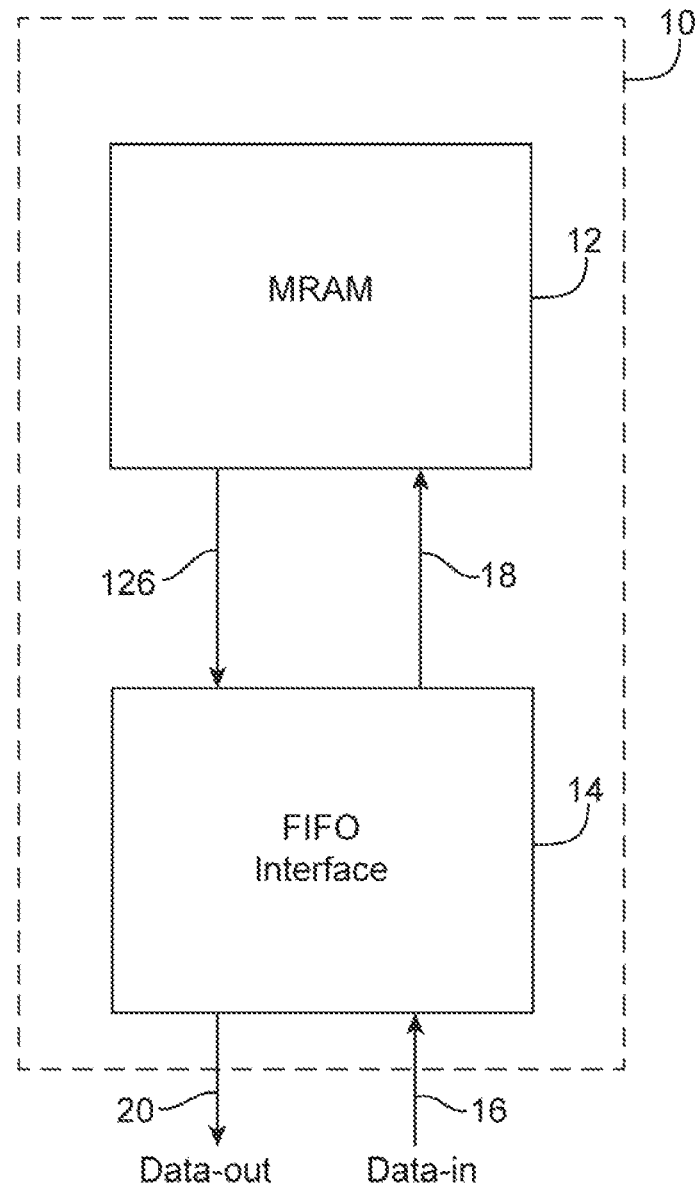
FIG. 1 shows a magnetic memory system 10 in accordance with an embodiment of the invention.

FIG. 1 shows a magnetic memory system 10 in accordance with an embodiment of the invention. The system 10 is shown to include a magnetic random access memory (MRAM) 12 coupled to a first-in-first-out (FIFO) interface device 14 through a memory bus 18 (sometimes referred to herein as "datain" 18). The device 14 is shown to receive Data_in 16 as input and generates a FIFO output coupled onto the bus 18 for storage in the MRAM 12. The MRAM 12 generates the output mDO 126 for use by the device 14, at times, device 14 couples the same onto Data_out 20 of the magnetic memory system 10. At other times, the device 14 generates the output of the magnetic memory system 10 and couples the same onto Data_out 20. The Data_out 20 serves as output of the system 10, whereas the mDO 126 remains internal to the system 10. While the general operation of the system 10 is described below relative to FIG. 1, it is described in further detail relative to subsequent figures.

The MRAM 12 typically includes many magnetic memory elements with each element including at least one magnetic tunnel junction (MTJ). An MTJ, as well known, typically is made of a free layer, separated by from a fixed layer by a barrier (or "tunnel") layer. The fixed layer has a magnetic orientation that is fixed or permanent in a particular direction and while the free layer also has a magnetic orientation, its orientation switches relative to that of the fixed layer, when suitable electrical current flows through the MTJ. The switching of the free layer results in the MTJ storing different states, i.e. data.

A magnetic memory element is typically accessed through an access transistor, which together with the magnetic memory element is referred to as a magnetic memory cell. The magnetic memory cells comprise the MRAM 12 along with other non-magnetic circuitry used for reading and writing to the magnetic memory elements thereof.

Magnetic memory elements can be of a variety of types, such as but not limited to, spin-transfer torque, spin valve and other known magnetic memory.

It is well known that the time required to read information stored in a MRAM is fast and generally comparable to read a static random access memory (SRAM). It is equally well known that the time required to write information to MRAM is longer than that which is required for writing to a SRAM. For example, the time required to write to (write time) a SRAM is 1-10 nano seconds (ns) while the write time of a MRAM is 3-30 ns. In accordance with the various embodiments and methods of the invention, a user of the system 10 enjoys the use of MRAM with the benefits of comparable system performance of write operations. That is, memory performance of the system 10 is comparable to a system using SRAM, for example, by the system 10 effectively performing concurrent non-sequential write operations.

As will be shown in subsequent figures, the device 14 includes a FIFO, well known by those skilled in the art, and a FIFO logic block. The FIFO serves as a temporary location to load address and data from the outside (or by a user) and intended for storage in the MRAM 12. The FIFO within the device 14 writes (or "stores") and retrieves information in a certain order (for write to MRAM 12). That is, data that is first input is output first such that any data that is saved after the first input is necessarily retrieved after the first data. By way of example, if data 0 is saved first followed by data 1 being saved and followed by data 2 being saved, the order in which this data is retrieved is the same in that first, data 0 is retrieved and then data 1 is retrieved and next data 2 is retrieved. In some embodiments, concurrent write operations are performed to multiple MRAM sub-arrays (or "banks") comprising the MRAM 12 resulting in increased system performance. Further, write operations are queued per MRAM bank and queued write commands are issued by the FIFO at a later time, allowing multiple write operations to be performed without the requirement for sequential data. Data coherency is checked to return data from the queue of the device 14 rather than the MRAM 12 if the queue has the latest content at the accessed address (prior to writing to MRAM 12). "Return" as used herein refers to outputting data.

It is contemplated that any device that achieves the function of device 14 may be used in place of device 14.

The FIFO logic block within the device 14 serves to mediate the address and data that is loaded into the FIFO at a clock rate, "clks", and also serves to send data out to the MRAM 12 for writing at another rate, "clkm", in conjunction with a memory busy signal, in one embodiment of the present invention. In this case, the "clks" and the "clkm" need be synchronized in manners known to those in the art. Alternatively, a single clock is used by the FIFO logic block and the MRAM 12, in conjunction with a memory busy signal, to send data out from the FIFO to the MRAM. To speed up the write operation, data is first stored or saved in the device 14 through the coupling of the incoming data onto the Data_in 16 and then saved into MRAM 12 in the order described above. This allows an overall faster write operation time of the magnetic memory system 10 because since writing is being accomplished through the device 14, data can be read from the Data_out 20 with the net effect of the write operations of the system 10 being comparable to that of a system using SRAM. In accordance therewith, at times, such as when data has not had a chance to make it from the device 14 into the MRAM 12 before it is accessed by a user of the system 10, it may be retrieved directly from the device 14, as will become further evident below.

Accordingly, the magnetic memory system 10 generally functions as or emulates an SRAM or its variants, such as pseudo SRAMs, synchronous SRAMs, and double data rate synchronous static random access memory (DDR SRAM) with comparable system performance.

Figure 2:
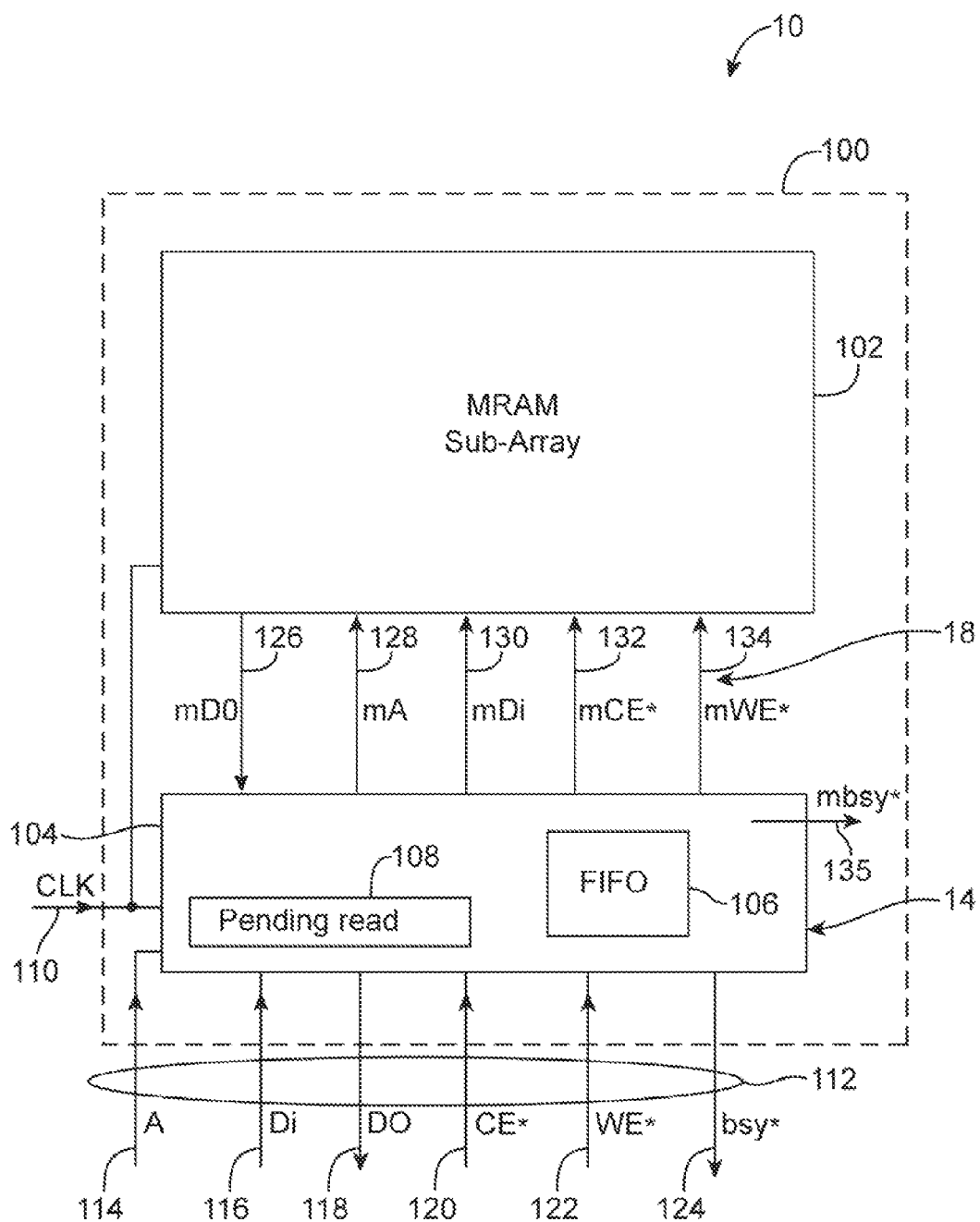
FIG. 2 shows a block diagram of a portion of the system 10, in accordance with an embodiment of the invention.

FIG. 2 shows a block diagram of a portion of the system 10, in accordance with an embodiment of the invention. The system 10 is shown to include a magnetic memory bank 100 having a magnetic random access memory (MRAM) sub-array (or "bank") 102 and a portion of the interface 14, bank interface 104, coupled to the bank 102 through the memory bus 18. The bank 102 is one of many MRAM banks in the MRAM 12 of FIG. 1. The bank interface 104, shown in FIG. 2, is responsive to interface signals 112, which is a part of the Data_in 16 and the Data_out 20 of FIG. 1. The signals 112 are shown to include an address 114, an input data (Di) 116, output data (Do) 118, chip enable (CE*) 120, write enable (WE*) 122 and busy (bsy*) 124. Clock (CLK) 110 is shown provided, as input, to the bank interface 104 shown in FIG. 2. The interface 104 is shown to include FIFO 106 and in some embodiments, optionally includes pending read register 108.

As will be appreciated by the discussion below, the FIFO 106 generally functions as a queue and in some embodiments, functions as a write queue for queuing commands and data during write operations.

The interface 104 is shown to be coupled to the bank 102 through a number of signals, which are a part of the bus 18, namely, the memory Data out (mDo) 126, the memory address (mA) 128, the memory Data in (mDi) 130, the memory chip enable (mCE*) 132 and the memory write enable (mWE*) 134 signals.

The address 114 is an address provided by the user of the system 10 and identifies a location in the system 10 where data is either retrieved or read. Di 116 is the data that is written or saved in the system 10 by a user of thereof and the Do 118 is data that is retrieved from the system 10 by the user. CE* 120 enables reading and/or writing to the system 10 and WE* 122 signals a write operation to the system 10. The bsy* 124 signals to the user whether or not the system 10 is in use. In this embodiment CE* 120 and WE* 122 are synchronous to clk 110.

The mDO 126 is data that is retrieved from the bank 102, the mA 128 is the address that is provided to the bank 102 for identifying a location therein, the mDi 130 is the memory input data or data that is provide to the bank 102 to be saved therein. The mCE* 132 is the memory chip enable that enables use of the bank 102 and the mWE* 134 is the memory write enable signal that indicates whether or not a write operation to the bank 102 is taking place. In this embodiment mCE* 132 and WE* 134 are synchronous to clk 110.

The mbsy* 135 signal is generated by the interface 104 and used internally to indicate whether the access time of the bank 102 is greater than one cycle, and a WAIT cycle need to be inserted to allow for proper completion of the write cycle. Accordingly, mbsy* 135 is asserted (or become active) on the first cycle of the write operation and is deasserted at the last cycle of the write operation.

The register 108, which is optionally used in some embodiments, saves the incoming command during a read operation, when the memory 102 is busy, that is read command becomes pending and not yet complete, as further discussed below.

The operation of the signals and structures shown in FIG. 2 is perhaps better understood relative to timing diagrams presented in subsequent figures and discussed later.

In one embodiment of the invention, the FIFO 106 stores units of data in fixed bursts of 1, 2 or 4 units of data, as an example.

In the case of a single MRAM bank operation, using the block diagram of FIG. 2, various scenarios are presented and explained as follows. The following scenarios assume that a write operation to the MRAM 12 is longer or requires more clock cycles than that which is required for read operations. "Cycle", as used herein, refers to a clock cycle, as readily known to those in the art.

One scenario is if the incoming command is a read command and a pending write operation (as indicated by the mCE*, mWE* and mbsy* 135 signals) is not in progress and the bank 102 is not being accessed, a read operation of the bank 102 is performed and the FIFO 106 is checked for an address match. An example of an address match is presented and discussed relative to FIG. 4. If there is a match, i.e. the pending write command in the FIFO 106 is to the same address as the one being read, the data in the FIFO 106 is returned (or coupled onto the Do 118, otherwise, the data in the bank 102 is returned. This scenario is shown, in part, and discussed accordingly relative to FIG. 5, at reference number 300.

Another scenario is if the incoming command is a read command and a pending write operation is in progress, the bsy* 124 is asserted and the read command is saved and becomes a pending read command (stored in the register 108) because the bank 102 is not idle (or it is busy). The pending read command is executed after the completion of the pending write operation that is in progress. This scenario is shown, in part, and discussed accordingly relative to FIG. 5, at reference number 324. Alternatively the FIFO 106 is checked for an address match, if there is a match the data in the FIFO 106 is returned else the bsy* is asserted, and the read command is saved and becomes a pending read command, which is executed after the completion of the pending write operation that is in progress.

Yet another scenario is if the incoming command is a read command and a pending write operation is in progress, the pending write operation is aborted and a read operation is preformed in the same cycle as the reception of the read command without asserting the bsy* 124 signal (or without waiting, i.e. no wait cycle required), and the FIFO is checked for an address match, as discussed above. That is, a match is detected if a pending write operation in the FIFO is taking place with the same address as that used in the read command, in which case, the data in the FIFO 106 is returned (or read), otherwise, the data in the bank 102 is returned. In the foregoing embodiment, register 108 is not required. Alternatively the FIFO 106 is checked for an address match, if there is a match the data in the FIFO 106 is returned and pending write in progress is not affected, else the pending write operation is aborted, and a read operation is preformed in the same cycle as the reception of the read command without asserting the bsy* 124 signal.

In yet another scenario, if an incoming command is a write command and the bank 102 is idle (or no pending commands are in progress) and the FIFO 106 is empty (no valid data is in the FIFO), the incoming command is saved in the FIFO 106 and optionally sent to the bank 102 to perform a write operation thereto. In the event this option is not taken, the current cycle is unused or wasted. This scenario is shown, in part, and discussed accordingly relative to FIG. 5, at reference number 302.

In another scenario, if the incoming command is a write operation and the bank 102 is idle (no pending commands are in progress) and the FIFO 106 is not empty, the incoming command is saved in the FIFO 106 and a pending command in the FIFO 106 (from the top of the FIFO) is sent to the bank 102 to perform a write operation thereto.

In yet another scenario, if an incoming command is a write command and the FIFO 106 is near full, the incoming command is saved in the FIFO 106 and the bsy* 124 is asserted and a pending command in the FIFO 106 (top of the FIFO) is sent to the bank 102 to perform a write operation thereto. Near full conditions are readily known to those in the art to be a predefined threshold at or above which the FIFO is considered or declared to be full. Generally, the function of a near full condition is to allow queuing of at least one more command to the FIFO. This scenario is shown, in part, and discussed accordingly relative to FIG. 6.

In yet another scenario, if the incoming command is a no operation (or "NOP" CE* not asserted), and the bank 102 is idle and the FIFO 106 is not empty, a pending command in the FIFO (top of the FIFO) is sent to the bank 102 to perform a write operation thereto.

When a pending write operation is written to the bank 102, it is removed from the pending commands in FIFO 106 and if bsy* 124 is asserted and the FIFO 102 is not in near full condition, the bsy* 124 is deasserted in the last cycle of the write operation.

In one embodiment, the bsy* 124 is asserted after edge of the clk 110, registering a command. In some embodiments, the rising edge of the clk 110 is used and in other embodiments, the falling edge of the clk 110 is used. If the bsy* 124 is asserted at the rising of the clk 100, then the cycle is a "wait" cycle and no command is registered (state of CE* 120 is ignored).

In another embodiment bsy* 124 is asserted before edge of clock registering command (in this case rising edge) and is valid at the said edge. In this embodiment if bsy* 124 is asserted at rising edge of the clk 110, the command is registered and the following cycle becomes the "wait" cycle.

Figure 3:
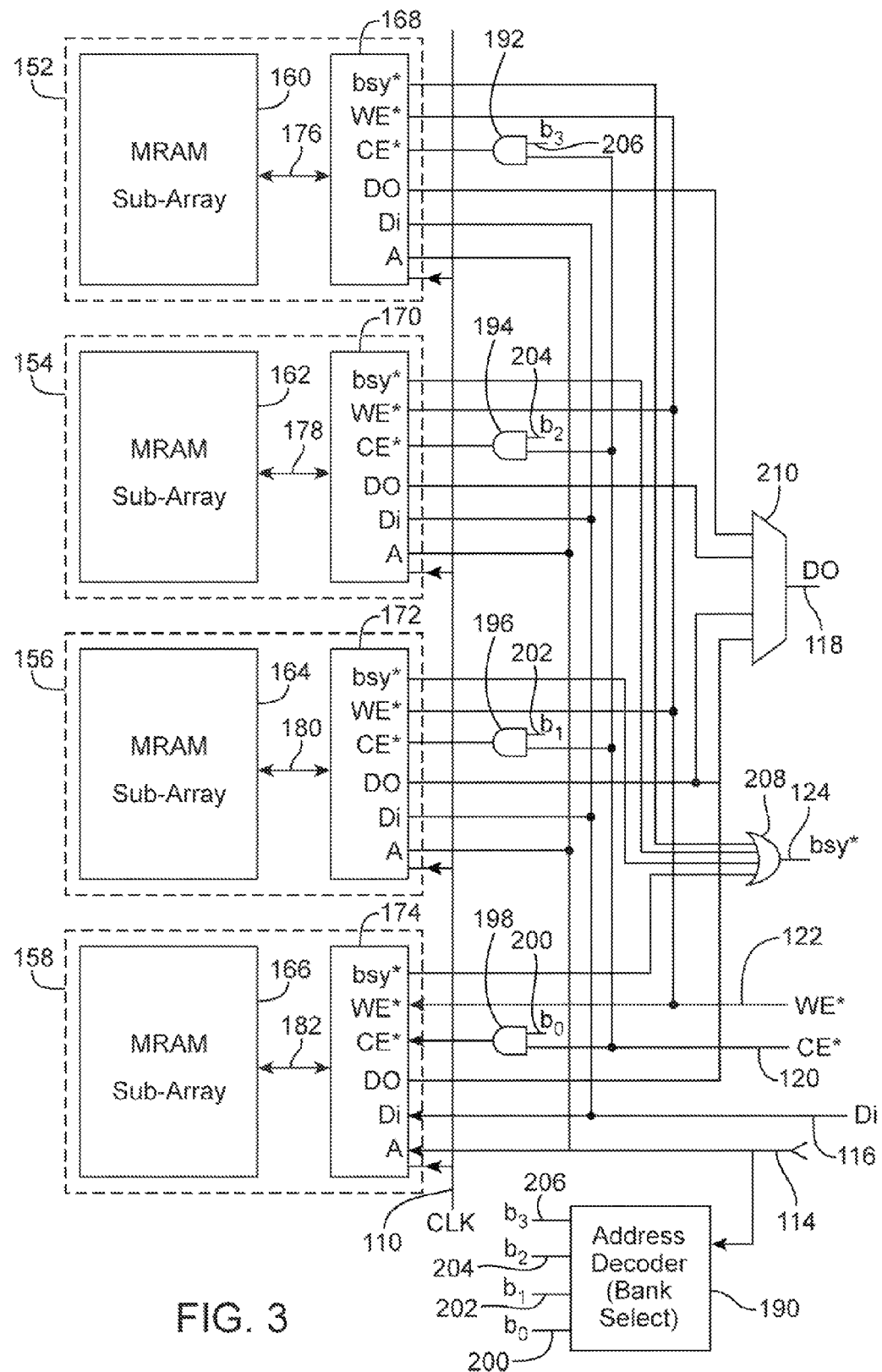
FIG. 3 shows a block diagram of multi-bank MRAM, in accordance with an embodiment of the invention

FIG. 3 shows a block diagram of additional MRAM banks in the system 10 of FIG. 1. Namely, magnetic memory banks 152-158 are shown and coupled to respective bank selects 192, 194, 196, and 198. Each of the banks 152-158 is analogous to the bank 102 of FIG. 2 and includes a FIFO interface device 14 labeled FIFO interface device 168, 170, 172 and 174. It is appreciated that while four banks are shown in FIG. 3, other number of banks are contemplated.

Each of the bank selects 192-198 receives as input a bank select signal, 206-200, respectively, and CE* 120. The bank select signals 200-206 are generated by the address decoder 190, which is responsive to the address 114 and uses the same to generate the signals 200-206. Accordingly, the address decoder 190 serves to select a bank to be accessed by activating one of the signals 200-206. It is appreciated that using more than four banks likely requires additional bank select signals to be generated by the decoder 190. Each of the selects 192-198, upon the activation of the signals, CE* 120 and a corresponding bank select signal, activates CE* 120, which is internal to the corresponding interface, among the interfaces 152-158. Alternatively, banks 152-158 receive an input that is used for assigning a number to each bank. For example, each bank has an additional two-digit binary input that can be used to assign an integer number (0, 1, 2 or 3) to each of the banks by permanently coupling the input to a logical value of "0" or "1". The address bits defining the banks are compared with the bank value and if matched and CE* 120 is asserted, the addressed bank is enabled.

The busy signal generator 208 receives the bsy* signals from each of the interfaces 152-158 and uses them to generate the bsy* 124. That is, in the case where any of the interfaces 152-158 are busy, the bsy* 124 is activated, otherwise, if none of the interfaces 152-158 are busy, the bsy* 124 is not activated. The notation "*", as used herein, generally refers to the negative polarity of a corresponding signal being the active state of the signal, however, it is noted that this is merely a design choice and the opposite polarity may be employed without departing from the spirit and scope of the invention.

The data output generator 210 selects between the data from each of the interfaces 152-158 to send to the user via the DO 118. This selection is based on which bank is being accessed.

Multiple MRAM banks of the system 10 allows for concurrency of data storage thereby increasing performance thereof, which is particularly noteworthy during write operations because in this respect, the performance of the MRAM of system 10 is comparable to the performance of a system utilizing SRAM.

Figure 4:
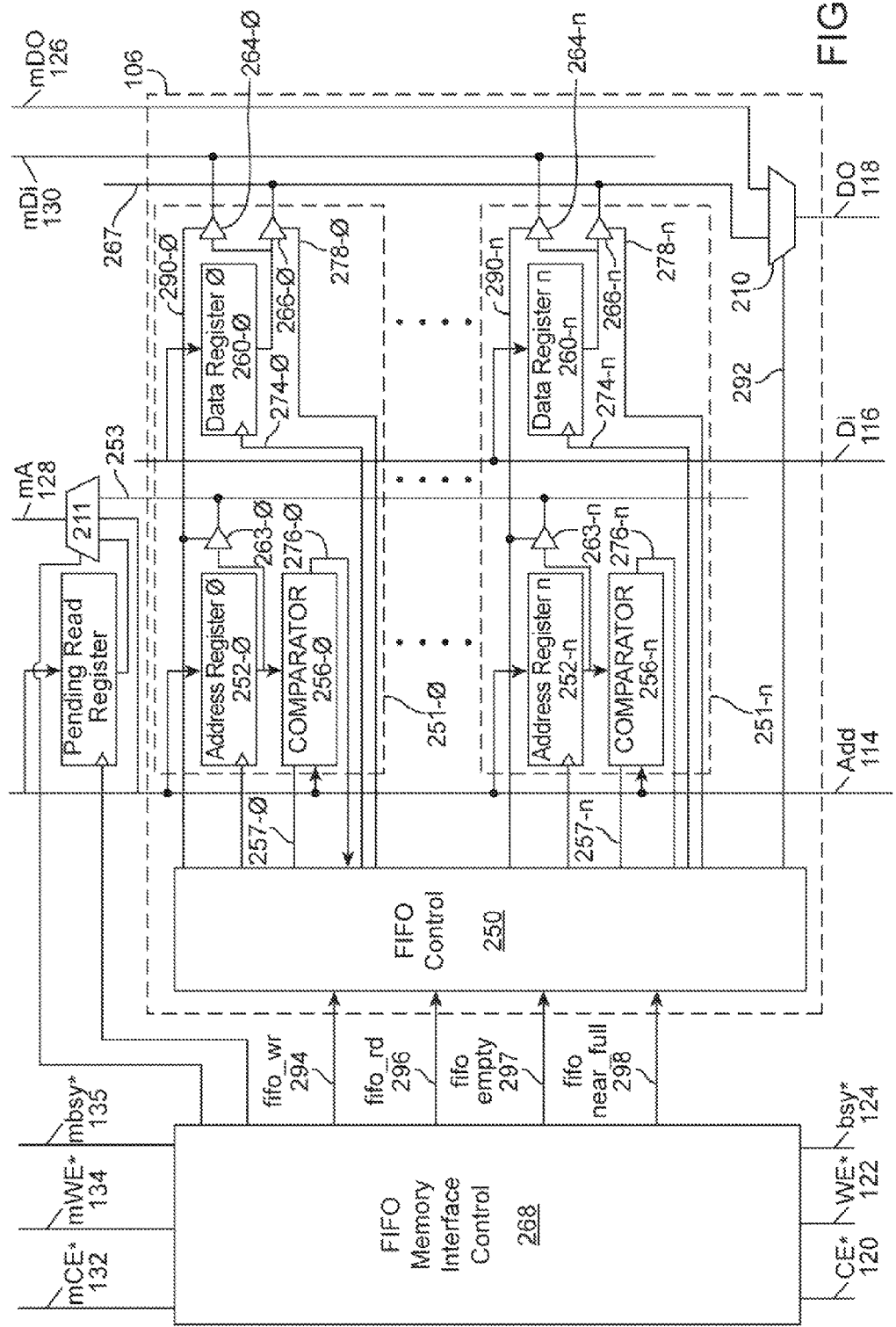
FIG. 4 shows a block diagram of further details of the FIFO 106 of FIG. 2.

FIG. 4 shows a block diagram of further details of the FIFO 106 of FIG. 2 and its interface with other blocks in FIFO interface 14. The FIFO 106 is coupled to FIFO memory interface control 268 and a memory address selector 211. The FIFO 106 is operative to FIFO write 294 and FIFO read 296 generated by memory interface control 268, and provides FIFO empty status 296 and FIFO near full status 298 to the FIFO memory interface control 268. The FIFO 106 provides address 253 to memory address selector 211.

The FIFO 106 is shown to include a FIFO write control 250, a FIFO memory interface control 268, FIFO entries 251_0 through 251_n (where n is an integer), and the data output selector 210. For the sake of simplicity only two FIFO entries, FIFO entries 251_0 and FIFO entry 251_n are shown in FIG. 4, it is understood that additional ones are identical in structure and function. The FIFO control 250 is coupled to FIFO entries 251_0 through 251_n, FIFO memory interface control 268, and the data output selector 210. The data output selector 210, couples either the mDO 126 or internal bus 170 onto DO 118 depending on select signal 292 from FIFO control 250.

The FIFO entry 251_0 comprises an address register 252_0, comparators 256_0, data registers 260_0, data selects 264_0, data selects 266_0. FIFO control 250 is shown coupled to the address registers 252_0, data blocks 260_0, comparator 256_0, data select 264_0, and data select 266_0. The address register 252_0 receives input 272_0 from the FIFO write control 250 to load the address 114 in the register. The data registers 260_0 receives input 274_0 from the FIFO write control 250 to load the input Di 116 in the register. The comparators 256_0 receive address 114 as input and also receive as input the contents of address register 252_0, along with compare enable 257_0; indicating that the entry is a valid entry, from FIFO control 250. The comparator 256_0 output; compare 276_0, is input to the FIFO control 250. The output of the data registers 260_0 is provided as input to a data selects, 264_0 and 266_0. Data select 264_0 couples the output of data register 260_0 to mDi 130, when enable 290_0 from FIFO control 250 is asserted. Similarly data select 266_0 couples the output of data register 260_0 to internal bus 170, when enable 266_0 from FIFO control 250 is asserted. The output of the address registers 252_0 is provided as input to a select 263_0 that couples the output of address register 252_0 to address 253, when enable 290_0 from FIFO control 250 is asserted. As mentioned earlier FIFO entries 251_0 and FIFO entry 251_n shown in FIG. 4 are identical in structure and function.

In operation, when the FIFO memory interface control detects a write command, it will save the command (address and data) in a FIFO entry (address register and data register of the entry) by asserting a FIFO write 297, the FIFO write pointer will advance to next entry at next cycle and make the current entry valid.

In operation, when the FIFO memory interface control detects an idle cycle or a write command, and FIFO not empty, and MRAM idle it will issue a pending write (from top of FIFO) and upon completion of write it will assert a FIFO read 296 to advance top of FIFO to next entry in FIFO and make the current entry invalid.

The FIFO 106 of FIG. 4 checks data coherency, and returns data from FIFO if the FIFO interface device 14 holds the most recent data that is being accessed by the user of the system 10. In operation the FIFO control 250 provides a compare enable 257-0 through 257_n to the comparator within each entry 251_0 through 251_n to enable comparison of address stored in address registers 252_0 through 252_n with incoming address 114. When compare enable 257-0 through 257_n is asserted it indicates the entry is valid and comparison is enabled, The output of comparators 276_0 through 276_n is provided to FIFO control 250, if any of the comparator outputs is asserted it indicates the latest data is in FIFO and FIFO control 250 asserts the select 292 of the data output selector 210 to couple data bus 267 from FIFO to data out 118, else memory data output 126 is coupled on the data out 118. In this respect, data coherency is performed to return data if the device 14 holds the most recent data that is being accessed, otherwise the data in the MRAM 12 is output.

Figure 5:
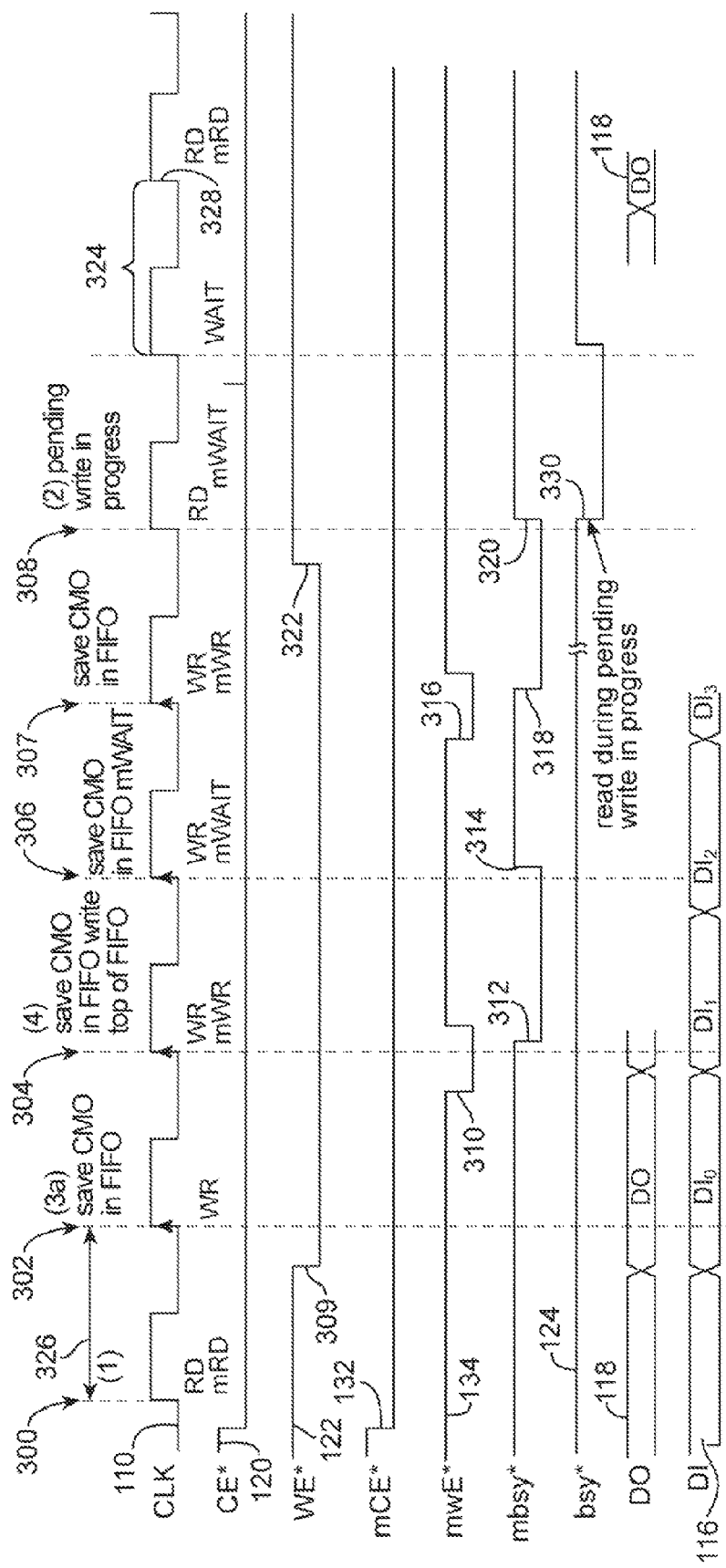
FIG. 5 shows a timing diagram of the behavior of some of the signals shown in previous figures during a number of the scenarios discussed hereinabove.

FIG. 5 shows a timing diagram of the behavior of some of the signals shown in previous figures during a number of the scenarios discussed hereinabove. More specifically, the clk 110, CE* 120, WE* 122, mCE* 132, mWE* 134, mbsy* 135, bsy* 124 signal, DO 118, and DI 116, are shown. In all the timing diagram figures herein MRAM read operation takes one cycle of clk 110, and MRAM write requires two cycles of clk 110. A clk 110 cycle is shown by the reference number 326. In the scenarios discussed, which, as appreciated, are some of many other scenarios, including but not limited to memory cycles being more than or less than two clock cycles.

At 300, the first scenario presented above, where a read operation takes place. At 300, CE* 120 is active, WE* 122 is inactive, mCE* 132 is active, mWE* 134 is inactive, mbsy* is inactive, and bsy* 124 is inactive. In this scenario, the incoming command is a read command and a pending write operation (as indicated by the mCE* and the mWE* signals) is not in progress and the MRAM 12 is not being accessed, a read operation of the MRAM 12 is performed and the FIFO 106 is checked for an address match. In this case, there is a match, (what in the timing diagram indicates that? Additionally below on line 16 you say fifo is empty, to be consistent you can say we assume the fifo empty and the memory data is returned) i.e. the pending write command in the FIFO 106 is to the same address as the one being read, the data in the FIFO 106 is returned (or coupled onto the DO 118).

At 302, the WE* 122 is at a state signifying a write operation and was inactivated at 308. Accordingly, in this scenario, the incoming command is a write command and the MRAM 12 is idle (or no pending commands are in progress) and the FIFO 106 is empty (no valid data is in the FIFO), the incoming command is saved in the FIFO 106 followed by sending the incoming command to the MRAM 12 to perform a write operation thereto, at 304. Thus, at 310, the mWE* 134 is activated and at 312, the mbsy* is activated resulting in an additional clk 110 cycle being needed to account for the added time needed to complete writing to the MRAM 12. However note that bsy* is not asserted and the user can continue using the memory system 10.

During 306, the mbsy* 135 is asserted, indicating a MRAM wait cycle (MRAM is busy) the state of mCE* 132 is ignored. During 306, the incoming command is a write command (CE* 120 and WE* 122 asserted and bsy* 124 deasserted) and a pending write operation is in progress (mbsy* 135 asserted), the incoming command is saved in FIFO. Note that since FIFO is not near full condition bsy* remains deassered and the user can continue using the memory system 10. During cycle 306 at 314 the mbsy* 135 changes state to indicate that the MRAM 12 will not be busy in the next cycle and a command can be issued to MRAM in cycle 307. During 307, the incoming command is a write command (CE* 120 and WE* 122 asserted and bsy* 124 deasserted) and a pending write operation is started (mbsy* 135 asserted at 318), the incoming command is saved in FIFO. Note that since FIFO is not near full condition bsy* remains deassered and the user can continue using the memory system 10. During cycle 307 at 318 the mbsy* 135 is asserted to indicate that the MRAM 12 will be busy in the next cycle 308 and a command can not be issued to MRAM in cycle 308.

During 308, the incoming command is a read command (CE* 120 is asserted and WE* 122 is deasserted and bsy* 124 deasserted) and a pending write operation is in progress (mbsy* 135 asserted), the incoming command is a read command and the FIFO 106 is checked for an address match, the timing diagram assumes that at cycle 308 a match did not occur as indicated at 330 by the bsy* 124 being asserted and the read command is saved and becomes a pending read command (stored in the register 108) because the MRAM 12 is not idle (or it is busy). The pending read command is executed immediately after the completion of the pending write operation that is in progress in cycle 324. Subsequently, at 324, a "wait" cycle takes place allowing time for the completion of the read operation with DO 118 being output accordingly.

Figure 6:
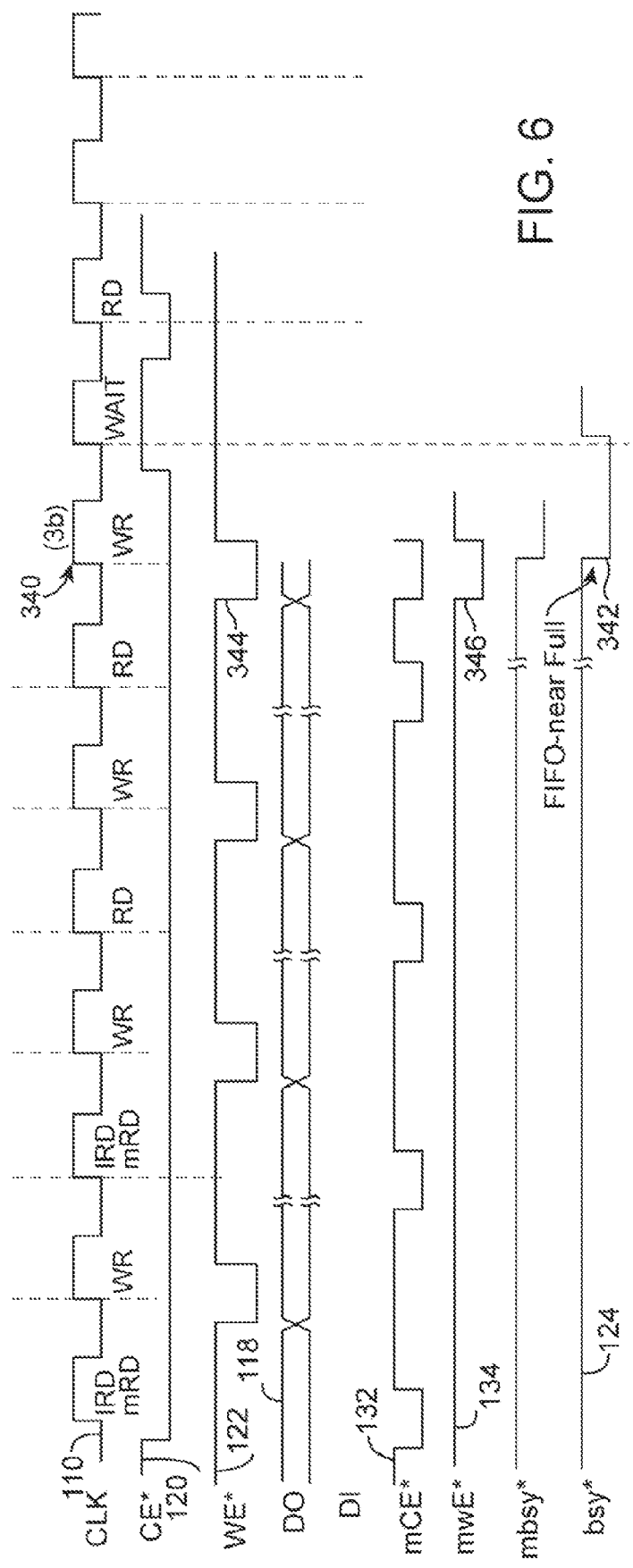
FIG. 6 shows a timing diagram of the behavior of some of the signals shown in FIG. 5 and particularly when the FIFO 106 is near full during a write operation.

FIG. 6 shows a timing diagram of the behavior of some of the signals shown in FIG. 5 and particularly when the FIFO 106 is near full during a write operation. More specifically, FIG. 6, during 340, shows the incoming command being a write command (shown at 344 with the WE* 122 being asserted) and a memory operation started (at 346, with the mWE* 134 being asserted) and the FIFO 106 being near full (shown at 342 with the bsy* 124 being activated), the incoming command is saved in the FIFO 106 and, as stated above, the bsy* 124 is asserted and a pending command in the FIFO 106 (top of the FIFO) is sent to the bank 102 to perform a write operation thereto.

It is understood that the foregoing timing diagrams are merely exemplary and other timing behavior and/or signals are contemplated. Additionally, the polarity of the signals shown and discussed herein are exemplary and opposite polarities may be employed.

FIG. 7 shows a block diagram of an apparatus 70 incorporating the magnetic memory system 71, which is analogous to the system 10. The apparatus 70, which is understood as being an exemplary application with many others being contemplated, is shown to include a digital circuitry 78 (comprising a micro processor) coupled to the magnetic memory system 71 and a ROM 72 and an analog circuitry 76 (comprising power on reset generator, low power voltage detect, voltage regulator and a NOR/NAND memory 80. The NOR/NAND memory 80 is another form of memory used to store data. Additionally the analog circuitry 76 transmits and receives analog data 72 and converts the analog data to digital form for use by the digital circuitry 78 through the digital data 78. The ROM 72 is yet another form of memory used to store data during manufacturing of the apparatus 70 and whose contents are read through the signals 80. The system 71 communicates data through the signals 82 to and from the digital circuitry 78. The apparatus 70 transmits and receives information through the interface 74, and the analog data 72. In some embodiments, the digital circuitry 78 is a microprocessor although other digital circuitry in addition thereto or in replacement thereof is contemplated.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic memory system comprising:
a magnetic random access memory (MRAM) bank operative to store data during a write operation initiated by a write command; a first-in-first-out (FIFO) coupled to the MRAM bank, the FIFO being operative to queue write commands and further operative to issue the queued write commands at a time when the MRAM bank is not in use, wherein the FIFO is operative to check data coherency to return data if the FIFO holds the most recent data that is being accessed, wherein the MRAM bank is coupled to a FIFO interface device, the FIFO interface device including a plurality of address blocks, a plurality of comparators, a plurality of data registers and a plurality of data selects, each of the plurality of address blocks being coupled to a data register of the data registers and responsive to an address identifying a location in the magnetic memory system to write data to and each of the plurality of data registers being responsive to input data and coupled to one of the plurality of data selects and responsive to the address, each of the comparators being responsive to an output from one of the address blocks of the plurality of address block and operative to compare the same to the address and if no match is detected to output data from the MRAM and if a match is detected, to output data from the FIFO interface device.

2. The magnetic memory system, as recited in claim 1, wherein the FIFO interface device includes a pending read register for storing pending read commands and further wherein, when a read command is issued when a pending write operation is in progress, the read command is saved in the pending read register and the contents of the pending read register becomes a pending read command, which is executed after completion of the pending write operation.

3. The magnetic memory system, as recited in claim 2, wherein a signal is activated to indicate that the magnetic memory system is busy during at least some of the time the pending write operation is pending.

4. The magnetic memory system, as recited in claim 1, wherein when a read command is issued and a write operation is in progress, the write operation that is in progress is aborted and the read operation is executed.

5. The magnetic memory system, as recited in claim 1, wherein after a write command is issued, while the MRAM is idle and the FIFO interface device is not empty, the FIFO interface device is operative to save and further operative to send a pending command, previously saved in the FIFO interface device, to the MRAM to perform a write operation of the MRAM.

6. The magnetic memory system, as recited in claim 1, wherein after a write command is issued and a write operation is in progress, the write command is saved and the write operation remains in progress.

7. The magnetic memory system, as recited in claim 1, wherein after a write command is issued when the FIFO interface device is near full, the FIFO interface device activates a signal to indicate that the magnetic memory system is busy.

8. The magnetic memory system, as recited in claim 1, wherein after a write command is issued and the FIFO interface device is near full, the FIFO interface device being operative to save the write command and to activate a signal to indicate that the magnetic memory system is busy, and if the MRAM is idle, the FIFO interface device being operative to send a pending command to the MRAM to perform a write operation thereof.

9. The magnetic memory system, as recited in claim 1, wherein the FIFO interface device is operative to queue a pending write operation to the MRAM, the pending write operation ultimately initiating a write operation to MRAM, and upon completion of write operation to remove the write operation from a queue of pending write operations.

10. The magnetic memory system, as recited in claim 1, wherein if a signal indicative of whether or not the magnetic memory system is busy is activated and the FIFO interface device is not near full, the signal is inactivated in the last cycle of the write operation.

* * * * *